(12) United States Patent
Adachi et al.

(10) Patent No.: US 7,435,896 B2
(45) Date of Patent: Oct. 14, 2008

(54) THERMOELECTRIC CONVERSION MATERIAL, THERMOELECTRIC CONVERSION ELEMENT USING THE MATERIAL, COOLING DEVICE AND ELECTRIC APPARATUS USING THE ELEMENT, AND ELECTRIC POWER GENERATION METHOD AND COOLING METHOD USING THE ELEMENT

(75) Inventors: Hideaki Adachi, Osaka (JP); Yasunari Sugita, Osaka (JP); Satoshi Yotsuhashi, Hyogo (JP); Tsutomu Kanno, Osaka (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 635 days.

(21) Appl. No.: 11/002,588

(22) Filed: Dec. 3, 2004

(65) Prior Publication Data
US 2005/0081906 A1  Apr. 21, 2005

Related U.S. Application Data

(63) Continuation of application No. PCT/JP2004/007107, filed on May 19, 2004.

(30) Foreign Application Priority Data
May 20, 2003  (JP)  ............................ 2003-141717

(51) Int. Cl.
*H01L 35/22* (2006.01)
(52) U.S. Cl. ...................... 136/240; 136/238; 136/201; 136/203; 136/205
(58) Field of Classification Search .......... 136/200–242
See application file for complete search history.

(56) References Cited

U.S. PATENT DOCUMENTS

2003/0056819 A1  3/2003  Imai et al.

(Continued)

FOREIGN PATENT DOCUMENTS

GB  1391625  *  4/1975

(Continued)

OTHER PUBLICATIONS

M. Onoda et al, "Spin fluctuation and the transport mechanism in vanadium oxide spinels with a metal-insulator transition", Phys. Rev. B. 56 (7), 3760-3771. (1997).*

(Continued)

*Primary Examiner*—Edna Wong
*Assistant Examiner*—Jeffrey T. Barton
(74) *Attorney, Agent, or Firm*—McDermott Will & Emery LLP (57) ABSTRACT

With conventional thermoelectric conversion materials, their thermoelectric conversion performance has been insufficient, and a problem has been to achieve stable performance in an oxidizing atmosphere and an air atmosphere. In view of this, according to the present invention, a thermoelectric material is made of a complex oxide that has vanadium oxide as its main component and is represented by the general formula $A_xVO_{x+1.5+d}$. Here, A is at least one selected from an alkali element, an alkaline-earth element, and a rare-earth element, x is a numerical value within the range of 0.2 to 2, and d is a non-stoichiometric ratio of oxygen and is a numerical value within the range of from −1 to 1.

26 Claims, 4 Drawing Sheets

U.S. PATENT DOCUMENTS

2003/0062553 A1* 4/2003 Ramesh et al. .............. 257/295

FOREIGN PATENT DOCUMENTS

| | | |
|---|---|---|
| JP | 7-231122 | 8/1995 |
| JP | 9-321346 | 12/1997 |
| JP | 11-266038 | 9/1999 |

OTHER PUBLICATIONS

H.T. Evans et al, "Crystal chemistry of the natural vanadium bronzes", American Mineralogist. 75, 508-521. (1990).*

F.J. DiSalvo, "Thermoelectric Cooling and Power Generation", Science. 285, 703-706. (1999).*

A. Tawfik, "Thermophysical properties of vanadium bronze polycrystals". J. Mater. Sci. Lett. 7, 1101-1103. (1988).*

Chinese Office Action, with English Translation, issued in Chinese Patent Application No. 200480010440, dated on Sep. 7, 2007.

Hui et al. "Conductivity and stability of SrVo3 and mixed perovskites at low oxygen partial pressures" Solid State Lonies, vol. 143, No. 3-4 pp. 275-283 Jul. 2, 2001.

* cited by examiner

THERMOELECTRIC CONVERSION MATERIAL, THERMOELECTRIC CONVERSION ELEMENT USING THE MATERIAL, COOLING DEVICE AND ELECTRIC APPARATUS USING THE ELEMENT, AND ELECTRIC POWER GENERATION METHOD AND COOLING METHOD USING THE ELEMENT

This application is a continuation of PCT/JP2004/007107, filed on May 19, 2004.

BACKGROUND OF THE INVENTION

1. Field of the Invention

The present invention relates to a thermoelectric conversion material for performing electron cooling or thermal power generation by energy conversion between thermal energy and electric energy, and a thermoelectric conversion element using the material. The present invention also relates to a cooling devise and an electric apparatus using the elements, and methods of converting energy using the element, such as electric power generation methods and cooling methods.

2. Description of the Related Art

Thermoelectric conversion elements are configured as follows. A plurality of p-type and n-type thermoelectric materials having positive and negative charge carriers, respectively, are joined alternately to form a certain number of junction pairs, and one type of junctions, which is, for example, pn junction along the direction of current flow, and the other type of junctions, which is np junction along the direction of current flow, are spaced apart from each other. Thermoelectric conversion elements perform cooling by passing current therethrough to cause a temperature difference between the junction regions, or perform power generation by causing a temperature difference between the junction regions to generate an electromotive force. To date, semiconductor materials such as Bi—Te, Pb—Te, and Si—Ge have been mainly researched as thermoelectric conversion materials, and some materials have been put to practical use in certain fields.

Nevertheless, property of the materials has not yet been satisfactory to attain full-fledged commercialization for general consumer products, and improvement in property of thermoelectric conversion materials has been demanded. Recently, among oxide materials, which were conventionally considered as unsuitable for thermoelectric materials, substances that exhibit high thermoelectric conversion performance, such as $Na_yCoO_2$ (y=0.2 to 1) having a layered bronze structure, have been found (see JP 09(1997)-321346A). The thermoelectric conversion performance of this system compares with that of Bi—Te, which is a practically usable thermoelectric semiconductor material, and it is highly expected that thermoelectric power generation will be realized with an oxide material that is stable even in an oxidizing atmosphere.

However, since $Na_yCoO_2$ tends to be adversely affected by humidity in air, a problem has been to achieve high thermoelectric performance in a normal air atmosphere.

It is an object of the present invention to provide an oxide material that has high thermoelectric conversion performance and is stable in an oxidizing atmosphere as well as in an air atmosphere.

SUMMARY OF THE INVENTION

A thermoelectric conversion material according to the present invention, which solves the foregoing problems, includes a complex oxide having vanadium oxide as its main component and represented by the general formula $A_xVO_{x+1.5+d}$. Herein, A is at least one element selected from an alkali element, an alkaline-earth element, and a rare-earth element; and x is a numerical value within the range of from 0.2 to 2. The non-stoichiometric ratio d of oxygen in the formula is approximately a numerical value within the range of from −1 to 1, although it is difficult to specify the value precisely since the value fluctuates depending on the production environment, the surrounding environment, or the like.

Thermoelectric conversion performance is dependent on electric resistivity ρ of the material and Seebeck coefficient S thereof, which can be defined by thermal electromotive force per temperature difference. Thermoelectric conversion power factor P, which reflects thermoelectric conversion performance, can be represented by the following equation, with electric resistivity ρ and thermal electromotive force S.

$$P = S^2/\rho$$

From this equation, it is appreciated that a thermoelectric conversion material having high conversion performance is such a material that has a large thermal electromotive force and a low resistivity. The thermoelectric conversion material employing the composition of the present invention shows a relatively low electric resistance while maintaining a large thermal electromotive force, and its thermoelectric conversion power factor P may often exceed 1 $mW/K^2m$. It is preferable that the thermoelectric conversion power factor of the material be equal to or greater than 1 $mW/K^2m$ since such a martial can be used as a practically usable thermoelectric material.

In particular, it is preferable that its crystal structure be made of a layered structure of vanadium oxide since, when this is the case, the thermoelectric conversion power factor may result in 1 $mW/K^2m$ or higher in many cases. Moreover, it is preferable that the element A be made of two or more kinds of elements selected from alkali elements, alkaline-earth elements, and rare-earth elements since, when this is the case, the thermoelectric conversion power factor may show a high value stably, which may be as high as 2 $mW/K^2m$ or higher.

As will be discussed in detail in the following Detailed Description of Preferred Embodiments, it should be understood that an electric-power generating method and a cooling method that use such a thermoelectric conversion material of the present invention are also encompassed by the scope of the present invention.

DETAILED DESCRIPTION OF THE INVENTION

Hereinbelow, preferred embodiments of a thermoelectric conversion material according to the present invention are described.

The present inventors attempted synthesizing of substances having an A-V—O composition using various elements A with regard to complex oxides containing vanadium oxide, for which their applicability to a thermoelectric material had hardly been researched, and carried out measurement of their thermoelectric performance. The manufacturing process was as follows. Source material oxides were weighed and mixed to be the composition represented by the chemical formula $AVO_{2.5+d}$, pre-fired at 920° C., and then pulverized. This process was repeated three times, and lastly the material was molded and subjected to a main firing in oxygen at 900° C. Here, the non-stoichiometric ratio d of oxygen in the formula was within a numerical value range of approximately −1 to 1, although it was difficult to specify the value precisely since it fluctuated depending on the production environment, the surrounding environment, or the like. It was possible to raise the value up to d=1.5 in certain environments, but in that case, the electric resistance increased and the thermoelectric performance was insufficient. After the firing, thermoelectric properties of the materials were evaluated at room temperature and 60% humidity. The results are shown in Table 1, which also shows the properties of $NaCoO_{2.5+d}$ for comparison.

TABLE 1

Thermoelectric properties of $AVO_{2.5+d}$ at room temperature and 60% humidity

| Element A | Crystal structure | Electric resistivity (mΩcm) | Thermal electromotive force (μV/K) | Power factor (mW/K²m) |
|---|---|---|---|---|
| Li | Layered bronze | 2.3 | 140 | 0.852 |
| Na | Layered bronze | 2 | 150 | 1.125 |
| K | Layered bronze | 3 | 160 | 0.853 |
| Ca | Layered bronze | 1.5 | 130 | 1.127 |
| Fe | Other | 10 | 120 | 0.144 |
| Cu | Other | 15 | 160 | 0.171 |
| Sr | Layered bronze | 1 | 150 | 2.250 |
| Y | Perovskite | 1.8 | 130 | 0.939 |
| Ag | Other | 4.5 | 80 | 0.142 |
| Cd | Other | 8 | 100 | 0.125 |
| In | Other | 7 | 60 | 0.051 |
| Sb | Other | 16 | 50 | 0.016 |
| Cs | Layered bronze | 3 | 130 | 0.563 |
| Ba | Layered bronze | 2 | 150 | 1.125 |
| La | Perovskite | 1.7 | 140 | 1.153 |
| Nd | Perovskite | 1.5 | 145 | 1.402 |
| Er | Perovskite | 1 | 125 | 1.563 |
| Hf | Other | 25 | 100 | 0.040 |
| Ta | Other | 34 | 120 | 0.042 |
| Pb | Other | 10 | 90 | 0.081 |
| Comp. Ex. $NaCoO_2$ | Layered bronze | 2 | 130 | 0.845 |

It was confirmed that among them, $AVO_{2.5+d}$ substances that exhibit relatively large thermoelectric conversion power factors were those in which the element A was: an alkali element, such as Li, Na, K, and Cs; an alkaline-earth element, such as Ca, Sr, and Ba; or a rare-earth element, such as Y, La, Nd, and Er.

Some of the materials showed higher thermoelectric performance than that of $NaCoO_2$ in a high humidity environment, and the results proved desirable as stable oxide thermoelectric materials. This is due to the fact that in the case of the materials having the foregoing composition, their electric resistance becomes low while maintaining a high thermal electromotive force, and some compositions also exhibit superconducting transition at low temperatures. Thus, when using an alkali element or an alkaline-earth element or a rare-earth element as element A, the thermoelectric conversion power factor exceeded 1.0 mW/K²m in some cases. It is preferable that the thermoelectric conversion power factor be 1.0 mW/K²m or greater because it surpasses the performance of thermoelectric oxide $NaCoO_2$ in a normal air atmosphere. Needless to say, the thermoelectric conversion material of the present invention is free from Co.

The proportional content of element A was varied minutely with the cases where the element A was Ca and the element A was La, and the thermoelectric properties of resultant substances $A_xVO_{x+1.5+d}$ were evaluated. The evaluated thermoelectric properties and the structures of the resultant substances are shown in Table 2.

TABLE 2

Thermoelectric properties of $A_xVO_{x+1.5+d}$ with varying proportion of element A

| Element A | Proportion | Crystal structure | Electric resistivity (mΩcm) | Thermal electromotive force (μV/K) | Power factor (mW/K²m) |
|---|---|---|---|---|---|
| Ca | 0.1 | Other | 4 | 120 | 0.360 |
| | 0.2 | Main phase is layered bronze | 2 | 150 | 1.125 |
| | 0.5 | Layered bronze | 1 | 150 | 2.250 |
| | 1.0 | Layered bronze | 1.5 | 130 | 1.127 |
| | 1.5 | Main phase is layered bronze | 2 | 130 | 0.845 |
| | 2.0 | Other | 2.5 | 140 | 0.784 |
| | 2.3 | Other | 4 | 100 | 0.250 |
| La | 0.1 | Other | 4 | 80 | 0.160 |
| | 0.2 | Other | 2.2 | 120 | 0.655 |
| | 0.5 | Main phase is perovskite | 2 | 130 | 0.845 |
| | 1.0 | Perovskite | 1.7 | 140 | 1.153 |
| | 1.5 | Main phase is layered perovskite | 1.5 | 160 | 1.707 |
| | 2.0 | Layered perovskite | 1.5 | 170 | 1.927 |
| | 2.3 | Other | 4 | 130 | 0.423 |

The results proved that relatively large thermoelectric conversion power factors were obtained when the proportion x of the element A was 0.2 to 2.0. The reason is thought to be that a layered structure of vanadium oxide tends to be easily formed in the foregoing range of composition, and thus, good thermoelectric performance was realized due to the lower dimension condition. The layered perovskite structure is composed of a layer of $VO_2$ square lattices in which oxygen octahedrons having vanadium at their center and sharing their vertices are spread over a plane. The layered bronze structure is composed of a layer of $VO_2$ triangular lattices in which vanadium oxygen octahedrons sharing their sides are spread over a plane. It was confirmed that when these layered structures of $VO_2$ lattices were formed, desirable results were obtained in terms of thermoelectric performance.

Hereinafter, preferred embodiments of use of a thermoelectric conversion material according to the present invention are described with reference to the drawings.

Figure 1:
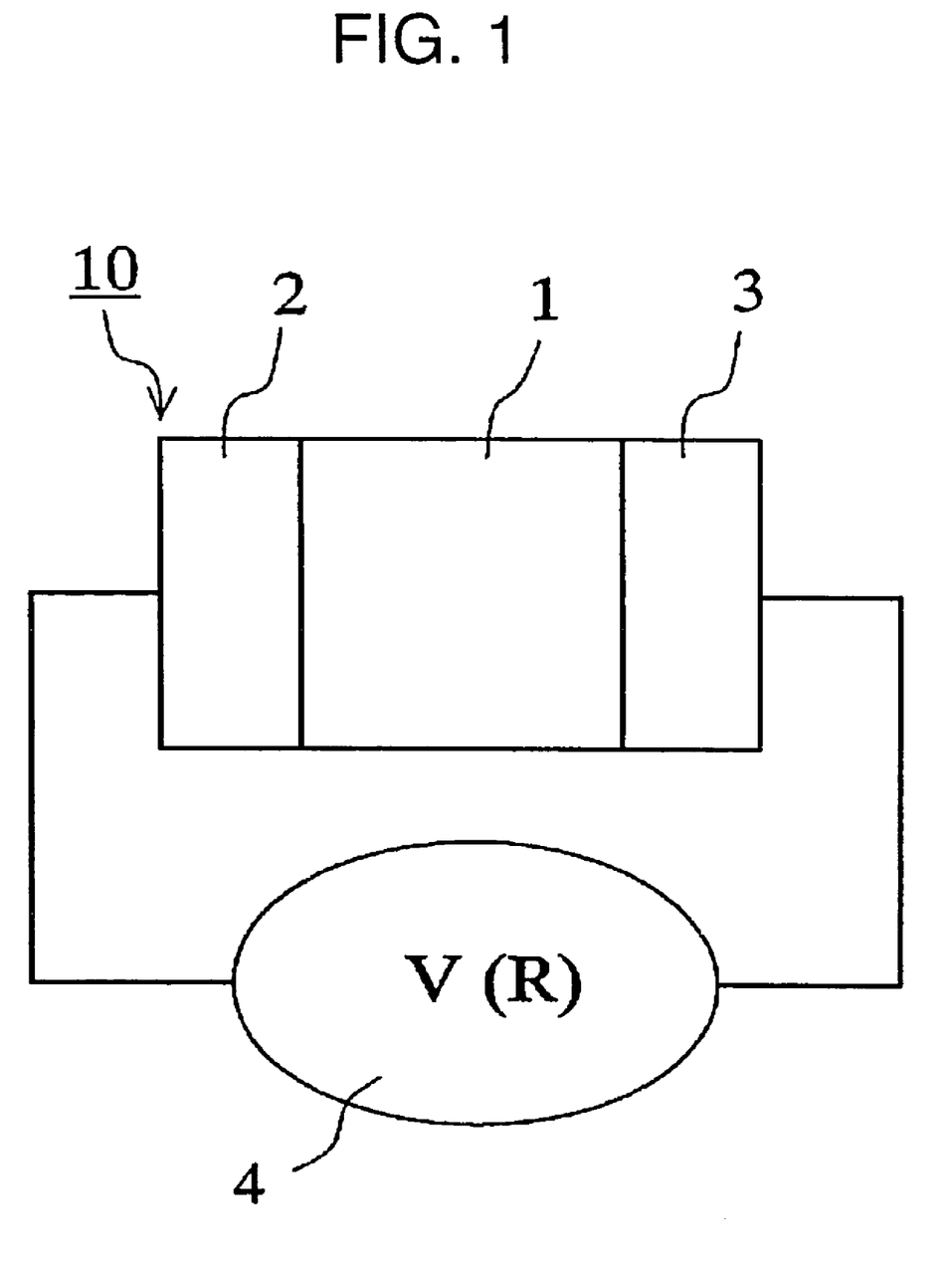
FIG. 1 is a view illustrating the configuration of one example of a thermoelectric conversion element according to the present invention.

As illustrated in FIG. 1, the simplest configuration for using a thermoelectric conversion material 1 of the present invention as a thermoelectric conversion element 10 is that in which a first electrode 2 and a second electrode 3 are connected so as to sandwich the thermoelectric conversion material 1. When these electrodes 2 and 3 are connected to an external dc power supply (V) 4, the thermoelectric conversion element 10 can be used as a thermoelectric-conversion cooling element utilizing the Peltier effect. In this case, one of the first electrode 2 or the second electrode 3 serves as a cooling part while the other one serves as a heat-generating part. Thus, when the cooling part becomes lower in temperature than the surrounding, heat is transferred from outside (for example, an article or atmosphere that is in contact with the cooling part) to the cooling part.

When the first electrode 2 and the second electrode 3 are connected to an external load (R) 4, the thermoelectric conversion element 10 can be used as a thermoelectric-conversion power-generating element utilizing the Seebeck effect. In this case, when heat is supplied to one of the first electrode 2 or the second electrode 3 to make it a high temperature part while the other one is made a low temperature part, a dc current flows into the load 4. Thus, the thermoelectric conversion element 10 is used by incorporating it into a circuit including the power supply or load 4.

Figure 2:
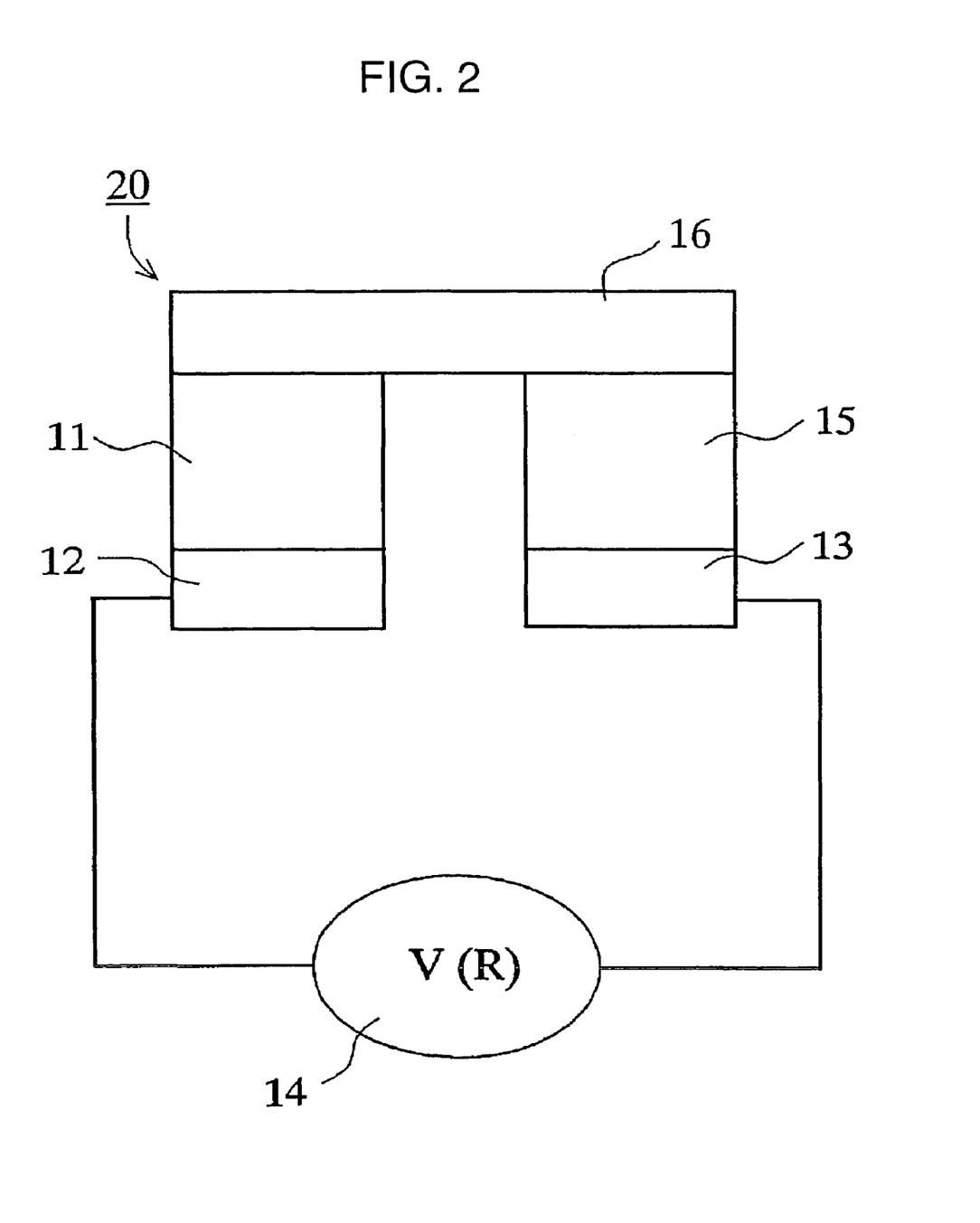
FIG. 2 is a view illustrating the configuration of another example of the thermoelectric conversion element according to the present invention.

Since the carrier in the thermoelectric conversion material of the present invention is electrons, the thermoelectric conversion material is an n-type thermoelectric conversion material having a negative Seebeck coefficient. For this reason, as illustrated in FIG. 2, when a thermoelectric conversion element 20 is configured using a p-type thermoelectric conversion material 15 together with the thermoelectric conversion material 11 according to the present invention, even higher thermoelectric performance is obtained. The thermoelectric conversion element 20 is further provided with a third electrode 16 that is disposed between the n-type thermoelectric conversion material 11 and the p-type thermoelectric conversion material 15 and with a first electrode 12 and a second electrode 13 that are disposed on opposing ends of the element 20 and are for connecting the element 20 to a power supply or load 14.

Figure 3:
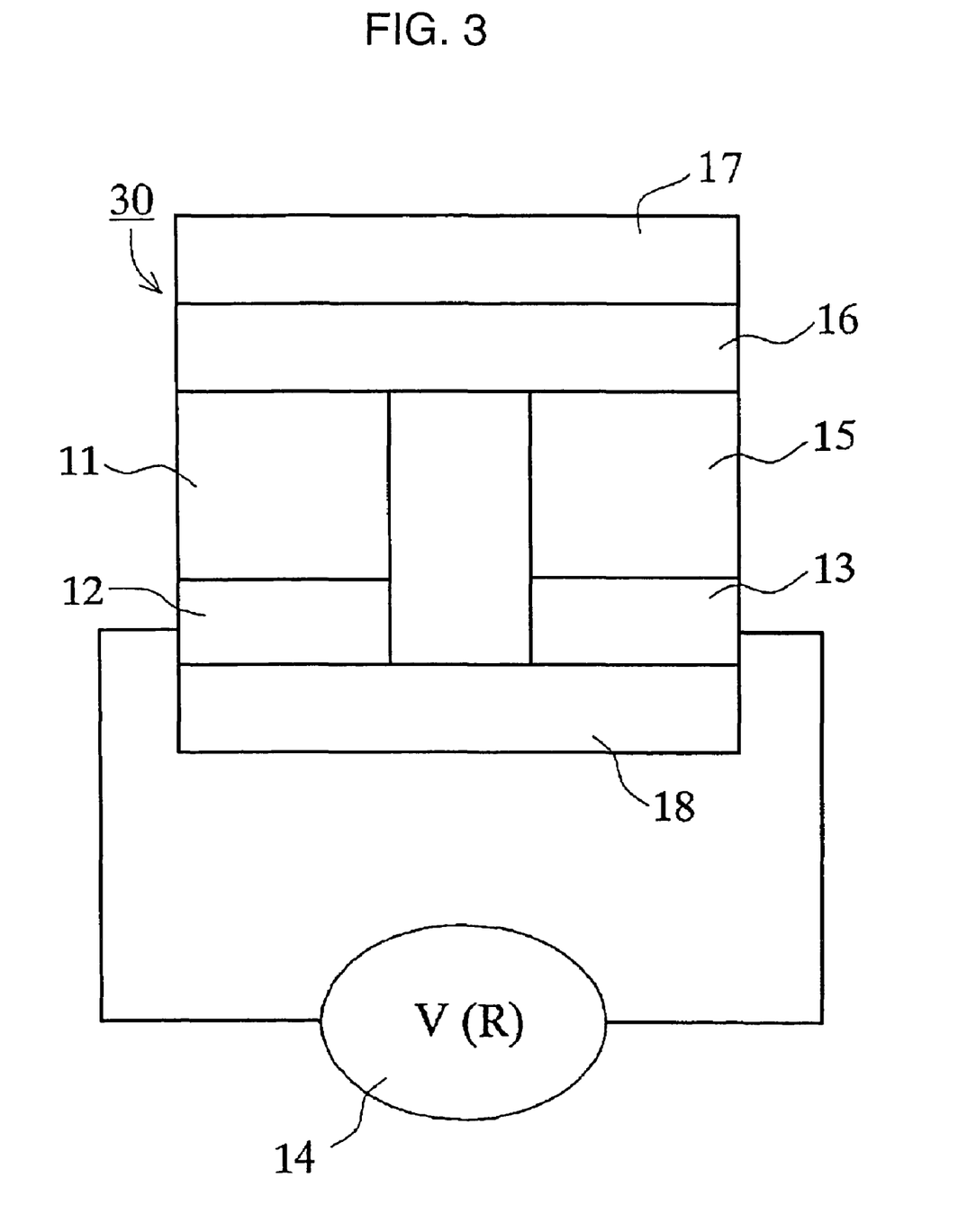
FIG. 3 a view illustrating the configuration of still another example of the thermoelectric conversion element according to the present invention.

As illustrated in FIG. 3, it is also possible to configure a thermoelectric conversion element 30 that is further provided with a first insulator 17 and a second insulator 18. In this element 30, the first insulator 17 is connected to the electrode 16, and the second insulator 18 is connected to the electrodes 12 and 13, respectively.

When a dc current is supplied from the power supply 14 to the thermoelectric conversion element 30 anticlockwise in the circuit of FIG. 3, the third electrode 16 and the insulator 17 serve as a low temperature part whereas the first and second electrodes 12 and 13, and the second insulator 18 serve as a high temperature part. Switching over the low temperature part and the high temperature part may be effected by reversing the direction of the current. When heat is appropriately released from the second insulator 18, which is a high temperature part, the first insulator 17, which is a low temperature part, becomes a heat-absorbing part (cooling part) that absorbs heat from outside (for example, an article or a fluid, such as gas and liquid, that is in contact with the insulator). In this case, the thermoelectric conversion element 30 is a local cooling element that converts electric energy into thermal energy. The device shown in FIG. 3 can be used as a cooling device including the thermoelectric conversion element 30 and a dc power supply 14 electrically connected to the element 30.

When, for example, the first insulator 17 is exposed to a high temperature atmosphere or brought into contact with a high temperature fluid so that a temperature difference is caused between the first and second insulators 17 and 18, an electromotive force is produced between the first electrode 12 and the second electrode 13. This electromotive force can be taken out as electric power from the load 14. For supplying heat to the first insulator 17, it is possible to utilize exhaust heat from various devices or body heat of living organisms such as human bodies. In these cases, the thermoelectric conversion element 30 is a power-generating element that converts the thermal energy supplied to the first insulator 17 into electric energy. The device shown in FIG. 3 may be used as an electric apparatus including the thermoelectric conversion element 30 and a load 14 that is electrically connected to the element 30 and is operated with electric current supplied from the element 30. Suitable examples of the load 14 are electronic components represented by motors, lighting apparatus, and various resistance elements, but it is not particularly limited thereto as long as it can perform a predetermined function with electric current. The foregoing term "to operate" means that the load performs a predetermined function.

Figure 4:
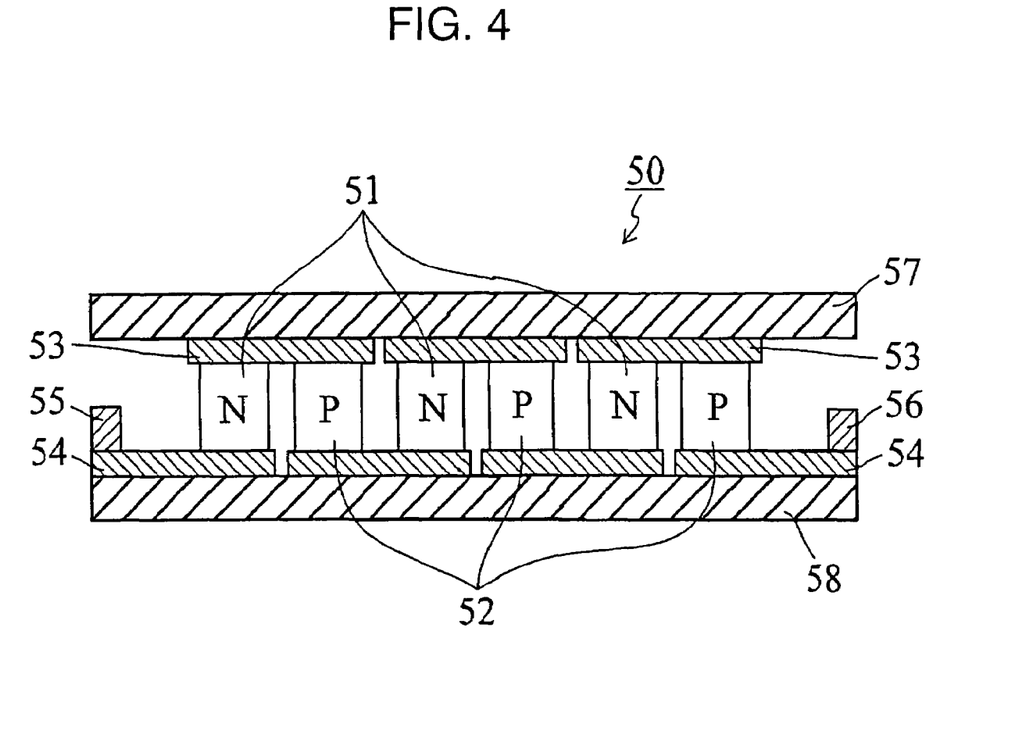
FIG. 4 is a cross-sectional view illustrating yet another example of the thermoelectric conversion element according to the present invention.

As illustrated in FIG. 4, a thermoelectric conversion element 50 may be configured in which a plurality of n-type thermoelectric conversion materials 51 and a plurality of p-type thermoelectric conversion materials 52 are connected electrically in series and alternately. This thermoelectric conversion element 50 is to be connected to an external power supply or an external load, via external electrodes (output electrodes) 55 and 56. In cases where the external electrodes 55 and 56 are to be distinguished strictly, they are referred to as a first external electrode 55 and a second external electrode 56, respectively.

First electrodes 53 and second electrodes 54 are disposed at the contacts with the n-type thermoelectric conversion materials 51 and the p-type thermoelectric conversion materials 52. When following the current path from one external electrode 55 (56) to the other external electrode 56 (55) in the element, the first electrodes 53 (54) are present at passing points from the n-type thermoelectric conversion materials 51 to the p-type thermoelectric conversion materials 52, whereas the second electrodes 54 (53) are present on passing points from the p-type thermoelectric conversion materials 52 to the n-type thermoelectric conversion materials 51. For example, when the element 50 is connected to a dc power supply, one of the first electrodes 53 or the second electrodes 54 becomes a heat-generating part and the other one becomes a heat-absorbing part. A first insulator 57 and a second insulator 58 are respectively in contact with the first electrodes 53 and the second electrodes 54. In other words, the first electrodes 53 and the second electrodes 54 are alternately in contact with the first insulator 57 and the second insulator 58. In this element 50, for example, the first insulator 57 functions as a heat-releasing part whereas the second insulator 58 functions as a heat-absorbing part (cooling part), respectively.

Although there are no particular restrictions on the p-type thermoelectric conversion materials, usable examples include materials formed of $(Bi, Sb)_2Te_3$ alloys, Bi—Sb alloys, Pb—Te alloys, Ce—Fe—Sb type or Co—Sb type skutterudite compounds, or a pseudobinary solid solution of GaTe and $AgSbTe_2$, known as TAGS.

In order to reduce environmental load, it is preferable to use as the p-type thermoelectric conversion materials, for example, Si—Ge alloys, Fe—Si alloys, Mg—Si alloys, or layered oxides represented by the formula AMO (A is an alkali metal or an alkaline-earth metal, and M is a transition metal).

As the material for the electrodes, various metallic materials such as gold, silver, and copper may be used. The material for the insulators is not particularly limited either, and it may be selected from ceramic substrates, oxide insulators, and the like, as appropriate for the use.

EXAMPLES

Examples of the present invention are described below.

Example 1

A substance having a layered bronze structure and represented by the general formula $NaVO_{2.5+d}$, and substances in which a portion of Na thereof was substituted by another element were prepared by a ceramic firing process. Source material powders of $Na_2CO_3$ and $V_2O_5$ were used as main constituent components, and $Li_2CO_3$ and $CaO_2$ were used as source materials of additive elements. These were weighed and mixed to predetermined compositions; the mixtures were pre-fired three times at 890° C., and were pulverized, and were thereafter formed into pellets, which were subjected to main firing at the same temperature. The thermoelectric properties of the substances were evaluated at room temperature and 60% humidity, the results of which are summarized in Table 3.

TABLE 3

Thermoelectric properties of $AVO_{2.5+d}$ composed of two or more kinds of elements A

| Element A | Electric resistivity (mΩcm) | Thermal electromotive force (μV/K) | Power factor (mW/K²m) |
| --- | --- | --- | --- |
| Na | 2 | 150 | 1.125 |
| $Na_{0.9}Ca_{0.1}$ | 1.4 | 170 | 2.064 |
| $Na_{0.8}Ca_{0.2}$ | 1.2 | 150 | 1.875 |
| $Na_{0.9}Li_{0.1}$ | 2 | 160 | 1.280 |
| $Na_{0.8}Li_{0.2}$ | 2.5 | 160 | 1.024 |
| $Na_{0.9}Ca_{0.05}Li_{0.05}$ | 1.5 | 175 | 2.042 |

Thus, it was confirmed that thermoelectric performance was improved with the substances $AVO_{2.5+d}$ in which the element A was composed of two or more kinds of elements. The improvement may be due to the fact that by employing two or more elements for the element A, it was possible to optimize average values of ionic radiuses and valence numbers according to crystal structure; however, the details are not clearly understood as there are other uncertain factors.

As a consequence, the results were desirable as improvement in performance was confirmed when the element A was composed of a combination of two or more kinds of elements. In particular, it was preferable that in some cases it was possible to obtain substances that show a thermoelectric conversion power factor P of 2.0 or greater.

Example 2

A substance having a layered perovskite structure and represented by the general formula $La_2VO_{3.5+d}$, and substances in which a portion of La thereof was substituted by another element, were prepared using a ceramic firing process. Source material powders of $La_2O_3$ and $V_2O_5$ were used as main constituent components, and $SrO_2$, $Pr_2O_3$, and $CaO_2$ were used as source materials of additive elements. These were weighed and mixed to predetermined compositions; the mixtures were pre-fired three times at 920° C., then pulverized, and thereafter formed into pellets, which were subjected to main firing at the same temperature. The thermoelectric properties of the substances were evaluated at room temperature and 60% humidity, the results of which are summarized in Table 4.

TABLE 4

Thermoelectric properties of $A_2VO_{3.5+d}$ composed of two or more kinds of elements A

| Element A | Electric resistivity (mΩcm) | Thermal electromotive force (μV/K) | Power factor (mW/K²m) |
| --- | --- | --- | --- |
| La | 1.5 | 170 | 1.927 |
| $La_{0.9}Sr_{0.1}$ | 1.3 | 170 | 2.223 |
| $La_{0.8}Sr_{0.2}$ | 1 | 150 | 2.250 |
| $La_{0.7}Sr_{0.3}$ | 0.8 | 90 | 1.013 |
| $La_{0.9}Pr_{0.1}$ | 1.4 | 160 | 1.829 |
| $La_{0.8}Sr_{0.1}Ca_{0.1}$ | 1.2 | 160 | 2.133 |

Similarly, the results were desirable as improvement in performance was confirmed when the element A was made of combinations of two or more kinds of elements by element substitution. Here, although a rare-earth element La was employed as the element A, it is of course possible to configure thermoelectric conversion materials having good performance also in the cases of employing other elements such as other rare-earth elements, alkaline-earth elements, and alkali elements.

Example 3

$(Na_{0.9}Ca_{0.1})_{0.5}VO_{2+d}$ having a layered bronze structure was formed as a thin film on a sapphire substrate using a sputtering method. A complex oxide sintered compact of Na:Ca:V=9:1:15 in which the amount of vanadium was reduced from the stoichiometric proportion was used as a target, and a film having a thickness of 500 nm was grown on a c-plane of the sapphire substrate that was heated at 700° C. in an argon sputter gas containing 10% oxygen. It was confirmed that the thin film was epitaxially grown with its c-axis being perpendicular to the substrate. The thermoelectric properties thereof was measured at room temperature; the thermoelectric conversion power factor P was large, 3.3 mW/K²m, which exceeded that of the sintered compact, which was 2.2 mW/K²m. The reason is thought to be related to the fact that with the thin film sample, a crystal was epitaxially grown like a single crystal and that a layered structure tends to grow parallel to the substrate, easily forming a good structure.

Example 4

$(Sr_{0.8}La_{0.2})_2VO_{3.5+d}$ having a layered perovskite structure was formed on a (100) plane of a $SrTiO_3$ substrate using a sputtering method. With a complex oxide sintered compact target of Sr:La:V=8:2:5, sputtering was carried out in an argon atmosphere, and a thin film having a thickness of 500 nm was grown on a substrate that was heated at 750° C. It was confirmed that the thin film formed was an epitaxially-grown film with its c-axis oriented perpendicularly to the substrate plane. The electric properties thereof were measured at room temperature, and it was confirmed that while the ceramic showed a high electric resistance, 1 Ωcm or higher, the epitaxial thin film sample showed 5 mΩcm, demonstrating good electrical conduction. The result proved that the thin film exhibited a thermoelectric conversion power factor P of 3.1 mW/K²m, demonstrating that an excellent thermoelectric material was obtained. It is understood that the epitaxial thin film was given a stress from the substrate, and as a result, its electric resistance reduced, leading to excellent thermoelectric performance.

It should be noted that although the present example illustrated the fabrication of thin film using a sputtering method, it is of course possible to obtain a thin film of thermoelectric conversion material that has good performance using other techniques such as laser ablation and reactive deposition.

As has been described above, the present invention provides a material having excellent thermoelectric conversion characteristics, and promotes applications of energy conversion between heat and electricity, such as electron cooling and thermoelectric power generation; therefore, the industrial value of the present invention is significant.

The invention may be embodied in other forms without departing from the spirit or essential characteristics thereof. The embodiments disclosed in this application are to be considered in all respects as illustrative and not limiting. The scope of the invention is indicated by the appended claims rather than by the foregoing description, and all changes which come within the meaning and range of equivalency of the claims are intended to be embraced therein.

What is claimed is:

1. A thermoelectric conversion element comprising: a thermoelectric conversion material; and a first electrode and a second electrode connected to the thermoelectric conversion material,
   the thermoelectric conversion material represented by the general formula $A_xVO_{x+1.5+d}$, where A is at least one element selected from Na, K, Cs, Ca, Sr and Ba, x is 0.2 to 1.5, and d is from −1 to 1, wherein
   at least a portion of the thermoelectric conversion material has a layered bronze crystal structure, and
   wherein the thermoelectric conversion material is a single crystal thin film.

2. The thermoelectric conversion element according to claim 1, wherein the entirety of the thermoelectric conversion material has a layered bronze crystal structure.

3. The thermoelectric conversion element according to claim 1, wherein the thermoelectric conversion material has a thermal electromotive force of 90 µV/K²m or greater.

4. The thermoelectric conversion element according to claim 1, wherein the thermoelectric conversion material has a thermal electromotive power factor of 0.5 mW/K²m or greater.

5. The thermoelectric conversion element according to claim 1, wherein the thermoelectric conversion material has a thermoelectric conversion power factor of 3.0 mW/K²m or greater.

6. The thermoelectric conversion element according to claim 1, wherein the thermoelectric conversion material has an electric resistance of 5 mΩcm or less.

7. A cooling device comprising a thermoelectric conversion element according to claim 1 and a dc power supply electrically connected to the thermoelectric conversion element.

8. An electric apparatus comprising a thermoelectric conversion element according to claim 1, and a load electrically connected to the thermoelectric conversion element and operated by current supplied from the thermoelectric conversion element.

9. A thermoelectric conversion element comprising:
   a plurality of n-type thermoelectric conversion materials and a plurality of p-type thermoelectric conversion materials; wherein
   the plurality of n-type thermoelectric conversion materials and the plurality of p-type thermoelectric conversion materials are connected electrically in series and alternately; and
   at least one material selected from the plurality of n-type thermoelectric conversion materials is
   represented by the general formula $A_xVO_{x+1.5+d}$, where A is at least one element selected from Na, K, Cs, Ca, Sr and Ba, x is 0.2 to 1.5, and d is from −1 to 1, wherein
   at least a portion of the n-type thermoelectric conversion material represented by the general formula $A_xVO_{x+1.5+d}$ has a layered bronze crystal structure, and
   wherein the n-type thermoelectric conversion material represented by the general formula $A_xVO_{x+1.5+d}$ is a single crystal thin film.

10. The thermoelectric conversion element according to claim 9, wherein the entirety of the n-type thermoelectric conversion material represented by the general formula $A_xVO_{x+1.5+d}$ has a layered bronze crystal structure.

11. The thermoelectric conversion element according to claim 9, wherein the n-type thermoelectric conversion material represented by the general formula $A_xVO_{x+1.5+d}$ has a thermal electromotive force of 90 µV/K²m or greater.

12. The thermoelectric conversion element according to claim 9, wherein the n-type thermoelectric conversion material represented by the general formula $A_xVO_{x+1.5+d}$ has a thermal electromotive power factor of 0.5 mW/K²m or greater.

13. The thermoelectric conversion element according to claim 9, wherein the n-type thermoelectric conversion material represented by the general formula $A_xVO_{x+1.5+d}$ has a thermoelectric conversion power factor of 3.0 mW/K²m or greater.

14. The thermoelectric conversion element according to claim 9, wherein the n-type thermoelectric conversion material represented by the general formula $A_xVO_{x+1.5+d}$ has an electric resistance of 5 mΩcm or less.

15. A method of generating electric power using a thermoelectric conversion element comprising a thermoelectric conversion material, and first and second electrodes connected to the thermoelectric conversion material, the method comprising:
   supplying heat to the first electrode and the second electrode so as to cause a temperature difference therebetween, whereby a potential difference is caused between the first electrode and the second electrode; wherein the thermoelectric conversion material is a thermoelectric conversion material represented by the general formula $A_xVO_{x+1.5+d}$, where A is at least one element selected from Na, K, Cs, Ca, Sr and Ba, x is 0.2 to 2, d is from −1 to 1, at least a portion of the thermoelectric conversion material has a layered bronze crystal structure, and the thermoelectric conversion material is a single crystal thin film.

16. The method of claim 15, wherein the entirety of the thermoelectric conversion material has a layered bronze crystal structure.

17. The method of claim 15, wherein the thermoelectric conversion material has a thermal electromotive force of 90 µV/K²m or greater.

18. The method of claim 15, wherein the thermoelectric conversion material has a thermal electromotive power factor of 0.5 mW/K²m or greater.

19. The method of claim 15, wherein the thermoelectric conversion material has a thermoelectric conversion power factor of 3.0 mW/K²m or greater.

20. The method of claim 15, wherein the thermoelectric conversion materiahas an electric resistance of 5 mΩcm or less.

21. A cooling method using a thermoelectric conversion element comprising a thermoelectric conversion material, and first and second electrodes connected to the thermoelectric conversion material, the method comprising:

causing a potential difference between the first electrode and the second electrode so as to produce a temperature difference between the first electrode and the second electrode, whereby one of the first electrode and the second electrode is made a low temperature part;

wherein the thermoelectric conversion material is a thermoelectric conversion material represented by the general formula $A_xVO_{x+1.5+d}$, where A is at least one element selected from Na, K, Cs, Ca, Sr and Ba, x is 0.2 to 2, d is from −1 to 1, at least a portion of the thermoelectric conversion material has a layered bronze crystal structure, and the thermoelectric conversion material is a single crystal thin film.

22. The method of claim 21, wherein the entirety of the thermoelectric conversion material has a layered bronze crystal structure.

23. The method of claim 21, wherein the thermoelectric conversion material has a thermal electromotive force of 90 µV/K²m or greater.

24. The method of claim 21, wherein the thermoelectric conversion material has a thermal electromotive power factor of 0.5 mW/K²m or greater.

25. The method of claim 21, wherein the thermoelectric conversion material has a thermoelectric conversion power factor of 3.0 mW/K²m or greater.

26. The method of claim 21, wherein the thermoelectric conversion material has an electric resistance of 5 mΩcm or less.

* * * * *

UNITED STATES PATENT AND TRADEMARK OFFICE
CERTIFICATE OF CORRECTION

PATENT NO. : 7,435,896 B2  Page 1 of 1
APPLICATION NO. : 11/002588
DATED : October 14, 2008
INVENTOR(S) : Hideaki Adachi et al.

It is certified that error appears in the above-identified patent and that said Letters Patent is hereby corrected as shown below:

In Column 11, Line 22 (Claim 20), change "conversion materiahas" to --conversion material has--.

Signed and Sealed this

Thirty-first Day of March, 2009

JOHN DOLL
*Acting Director of the United States Patent and Trademark Office*